United States Patent
Ji (10) Patent No.: US 11,683,027 B2
(45) Date of Patent: Jun. 20, 2023

(54) COMPARATORS

(71) Applicant: ChangXin Memory Technologies, Inc., Hefei (CN)

(72) Inventor: Rumin Ji, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 153 days.

(21) Appl. No.: 17/287,496

(22) PCT Filed: Jun. 19, 2020

(86) PCT No.: PCT/CN2020/097020
§ 371 (c)(1),
(2) Date: Apr. 21, 2021

(87) PCT Pub. No.: WO2021/103500
PCT Pub. Date: Jun. 3, 2021

(65) Prior Publication Data
US 2022/0311429 A1  Sep. 29, 2022

(30) Foreign Application Priority Data
Nov. 28, 2019 (CN) .......................... 201911188793.3

(51) Int. Cl.
*H03K 5/24* (2006.01)
*H03K 5/1254* (2006.01)
(Continued)

(52) U.S. Cl.
CPC ......... *H03K 5/2481* (2013.01); *H03K 5/1254* (2013.01); *H03K 5/15073* (2013.01); *H03K 2005/00156* (2013.01)

(58) Field of Classification Search
CPC ............... H03K 5/1254; H03K 5/2481; H03K 5/15073; H03K 2005/00156
(Continued)

(56) References Cited

U.S. PATENT DOCUMENTS 4,443,717 A * 4/1984 Hague ...................... H03K 5/24
327/318
5,541,538 A * 7/1996 Bacrania .............. H03K 5/2445
327/563
(Continued)

FOREIGN PATENT DOCUMENTS

CN  104090619 A  10/2014
CN  104158517 A  11/2014
(Continued)

OTHER PUBLICATIONS

PCT/CN2020/097020 International Search Report dated Sep. 24, 2020.

*Primary Examiner* — Quan Tra
(74) *Attorney, Agent, or Firm* — Alston & Bird LLP (57) ABSTRACT

A comparator includes a first-stage op amp circuit, a second-stage op amp circuit, a bias circuit and a clamping circuit. The first-stage op amp circuit includes two voltage input terminals and a voltage output terminal; the second-stage op amp circuit is connected with the bias circuit and the voltage output terminal of the first-stage op amp circuit; and the clamping circuit is connected with the voltage output terminal of the first-stage op amp circuit. By adding a clamping circuit in the comparator, the highest voltage at the voltage output terminal of the first-stage op amp circuit can be clamped to a preset voltage. During the operation of the comparator, the voltage change range of the voltage output terminal of the first-stage op amp circuit is smaller, which reduces the discharge delay of the voltage output terminal of the first-stage op amp circuit, thereby increasing the flip speed of the comparator.

11 Claims, 5 Drawing Sheets

(51) Int. Cl.
*H03K 5/15* (2006.01)
*H03K 5/00* (2006.01)

(58) Field of Classification Search
USPC .......................................................... 327/65
See application file for complete search history.

(56) References Cited

U.S. PATENT DOCUMENTS

| | | | |
|---|---|---|---|
| 5,898,323 A * | 4/1999 | Suda ..................... | H03F 3/3001 |
| | | | 327/66 |
| 8,031,498 B2 * | 10/2011 | Deboy ................... | H03K 17/06 |
| | | | 363/127 |
| 2006/0012405 A1 | 1/2006 | Martins | |
| 2009/0167407 A1 * | 7/2009 | Okuyama ............... | H03F 1/342 |
| | | | 330/253 |
| 2012/0133632 A1 | 5/2012 | Hsu | |
| 2012/0319777 A1 * | 12/2012 | Cahalane .............. | H03F 1/0261 |
| | | | 330/252 |
| 2014/0070974 A1 | 3/2014 | Jin et al. | |
| 2014/0176199 A1 * | 6/2014 | van Liempd .......... | H03K 17/06 |
| | | | 327/109 |
| 2015/0207468 A1 | 7/2015 | Tsutomu | |

FOREIGN PATENT DOCUMENTS

| | | |
|---|---|---|
| CN | 205720085 U | 11/2016 |
| JP | 2003-273672 A | 9/2003 |
| JP | 2006352193 A * | 12/2006 |

* cited by examiner

COMPARATORS

CROSS REFERENCES TO RELATED APPLICATIONS

This application is a national phase entry of International Application No. PCT/CN2020/097020 filed on Jun. 19, 2020 which claims the benefit of priority to CN Patent Application CN 201911188793.3 filed on Nov. 28, 2019, both entitled "COMPARATORS", the contents of which are incorporated herein by reference in its entirety.

TECHNICAL FIELD

This disclosure relates to the field of integrated circuit technology, in particular, to a comparator circuit.

BACKGROUND

Existing comparator circuits are widely used in electronics. One requirement for the comparators is to be able to quickly acquire the result of the comparison, so that the next step can be processed shortly. For example, when an over-current abnormality is detected, it is hoped that the abnormal situation can be handled as soon as possible. However, due to the inherent delay of the comparator circuit itself, the processing speed is often lagging, and the flipping speed of the comparator is slow. This delay is mainly caused by charging and discharging delay at the output terminals of the first-stage operation amplifier (op amp) circuit and the second-stage op amp circuit in the comparator. For example, when the first comparison voltage VP is greater than the second comparison voltage VN, the output terminal of the first-stage op amp the circuit will pull down from a higher potential to the ground potential. When the first to-be-compared voltage VP is less than the second to-be-compared voltage VN, the output terminal of the first-stage op amp circuit will be pulled up to a high potential again. In addition, the rapid change of the output signal of the first-stage op amp circuit in the comparator will be coupled to the first to-be-compared voltage VP, forming kick back noise, which will not only cause interference to the to-be-compared voltage, but may also cause output erroneous flip.

SUMMARY

Thus, it is necessary to overcome the problems in the existing techniques that comparators' processing speed lags from delays by the charging and discharging at the output terminals, slow turning speed, and kick back noise interfering with the comparison voltage, resulting in errors of flipping outputs, etc.

The present invention provides a comparator, including: a first-stage op amp circuit, a second-stage op amp circuit, a bias circuit and a clamping circuit.

The first-stage op amp circuit includes two voltage input terminals and one voltage output terminal; the two voltage input terminals of the first-stage op amp circuit are used for inputting voltages to-be-compared.

The second-stage op amp circuit is connected to the bias circuit and the voltage output terminal of the first-stage op amp circuit.

The clamping circuit is connected to the voltage output terminal of the first-stage op amp circuit, and is used to clamp the highest voltage of the voltage output terminal of the first-stage op amp circuit to a preset voltage.

By adding a clamping circuit in the above-mentioned comparator, the highest voltage of the voltage output terminal of the first-stage op amp circuit can be clamped to the preset voltage. During the operation of the comparator, the voltage changing range of the voltage output terminal of the first-stage op amp circuit is relatively small, can reduce the discharge delay of the voltage output terminal of the first-stage op amp circuit, thereby improving the flip speed of the comparator. In addition, because the voltage change range of the output terminal of the first-stage op amp circuit is relatively small, the coupling effect of the voltage change at the voltage output terminal of the first-stage op amp circuit to the input voltage to-be-compared is also reduced accordingly, which can reduce the kick back noise of the input voltage to-be-compared, avoid interference to the to-be-compared voltage, and ensure the correctness of the output. At the same time, the above-mentioned comparator also has the advantages of having a simple structure, a low cost and easy implementation.

In one of the embodiments, the first-stage op amp circuit includes: a first PMOS transistor, a second PMOS transistor, a third PMOS transistor, a first NMOS transistor, and a second NMOS transistor; wherein, the gate of the first PMOS transistor is connected to the first voltage to-be-compared; the gate of the second PMOS transistor is connected to the second voltage to-be-compared; the gate of the third PMOS transistor is connected to the bias circuit, and the drain of the third PMOS transistor is connected to the source of the first PMOS transistor and the source of the second PMOS transistor; the gate and drain of the first NMOS transistor are short-circuited and connected to the drain of the first PMOS transistor, and the source of the first NMOS transistor is grounded; the gate of the second NMOS transistor is connected to the gate of the first NMOS transistor, and the drain of the second NMOS transistor is connected to the drain of the second PMOS transistor to be the output terminal of the first-stage op amp circuit. The voltage output terminal of the amplifier circuit, and the source of the second NMOS transistor is grounded.

In one of the embodiments, the clamping circuit includes a first switch transistor, the control terminal and the current input terminal of the first switch transistor are connected to the voltage output terminal of the first-stage op amp circuit, and the first The current output terminal of a switch transistor is connected with the gate of the second NMOS.

In one of the embodiments, the first switch transistor includes an NMOS transistor.

In one of the embodiments, the clamping circuit further includes a second switch transistor, the control terminal and current input terminal of the second switch transistor are connected to the voltage output terminal of the first-stage op amp, and the first current output terminal of the second switch transistor is connected with the voltage output terminal of the second-stage op amp.

In one of the examples, the second-stage op amp circuit includes: a fourth PMOS transistor and a third NMOS transistor; wherein, the gate of the fourth PMOS transistor is connected to the bias circuit; the gate of the third NMOS transistor is connected to the voltage output terminal of the first-stage op amp circuit, and the drain of the third NMOS transistor is connected to the drain of the fourth PMOS transistor as the voltage output terminal of the second-stage op amp circuit, and the source of the third NMOS transistor is grounded.

In one of the examples, the bias circuit includes: a fifth PMOS transistor and a current source; wherein, the gate of the fifth PMOS transistor is connected to the first-stage op amp circuit and the second-stage op amp circuit, and the drain of the fifth PMOS transistor is connected to the current source.

In one of the embodiments, the clamping circuit includes a switch transistor, the control terminal and current input terminal of the switch transistor are connected to the voltage output terminal of the first-stage op amp circuit, and the current output terminal of the switch transistor is connected with the output terminal of the second-stage op amp circuit.

In one of the embodiments, the switch transistor includes an NMOS transistor.

In one of the embodiments, the clamping circuit includes a switch transistor, the current input terminal of the switch transistor is connected to the voltage output terminal of the first-stage op amp circuit, and the control terminal of the switch transistor is connected to the bias voltage, and the current output terminal of the switch transistor is grounded.

In one of the embodiments, the switch transistor includes a PMOS transistor or a PNP type transistor.

In one of the embodiments, the clamping circuit includes: a first switching transistor, a second switching transistor, and a third switching transistor; wherein, the current input terminal of the first switch transistor is connected to the voltage output terminal of the first-stage op amp circuit, the control terminal of the first switch transistor is connected to the current output terminal of the second switch transistor and the current input terminal of the three switch transistor; the control terminal of the second switch transistor is connected to the bias circuit; the control terminal of the third switch transistor is short-circuited with the current input terminal of the third switch transistor, and the circuit output terminal of the third switch transistor is grounded.

In one of the embodiments, the first switch transistor includes a PMOS transistor or a PNP type transistor, the second switch transistor includes a PMOS transistor, and the third switch transistor includes an NMOS transistor.

It should be understood that the above general description and the following detailed description are only exemplary and cannot limit the present disclosure.

DESCRIPTION OF REFERENCE NUMERALS

10 The first-stage op amp circuit
11 The second-stage op amp circuit
12 Bias circuit
13 Clamping circuit

DETAILED DESCRIPTION OF THE PREFERRED EMBODIMENTS

In order to facilitate the understanding of this application, the following will make a more comprehensive description of this application with reference to the relevant drawings. The preferred embodiment of the application is shown in the accompanying drawings. However, this application can be implemented in many different forms and is not limited to the embodiments described herein. On the contrary, the purpose of providing these embodiments is to make the disclosure of this application more thorough and comprehensive.

It should be noted that when an element is considered to be "connected" to another element, it may be directly connected to and integrated with another element, or there may be a centering element at the same time. The terms "installed", "one end", "the other end" and similar expressions used herein are for illustrative purposes only.

Unless otherwise defined, all technical and scientific terms used herein have the same meaning as commonly understood by those skilled in the technical field of this application. The terminology used in the specification of the application herein is only for the purpose of describing specific embodiments, and is not intended to limit the application. The term "and/or" as used herein includes any and all combinations of one or more related listed items.

In one embodiment, as shown in FIGS. 1 to 5, a comparator of the present disclosure includes: a first-stage op amp circuit 10, a second-stage op amp circuit 11, a bias circuit 12, and a clamping circuit 13; among them, the first-stage op amp circuit 10 includes two voltage input terminals and one voltage output terminal; the two voltage input terminals of the first-stage op amp circuit 10 are used for inputting the voltage to-be-compared; the second-stage op amp circuit 11 is connected to the bias circuit 12 and the voltage output terminal of the first-stage op amp circuit 10; the clamping circuit 13 is connected with the voltage output terminal of the first-stage op amp circuit 10, and the clamping circuit 13 is used to connect the voltage output terminal of the first-stage op amp circuit and clamp the highest voltage to the preset voltage.

Specifically, one input terminal of the first op amp circuit 10 is used to input the first to-be-compared voltage VN, and the other input terminal of the first op amp circuit 10 is used to input the second to-be-compared voltage VP.

In an example, continue to refer to FIGS. 1 to 5, the first-stage op amp circuit 10 includes: a first PMOS transistor MP1, a second PMOS transistor MP2, a third PMOS transistor MP3, a first NMOS transistor MN1, and a second NMOS transistor MN2; wherein the gate of the first PMOS transistor MP1 is connected to the first to-be-compared voltage VN; the gate of the second PMOS transistor MP2 is connected to the second to-be-compared voltage VP; the gate of the third PMOS transistor MP3 is connected to the bias circuit 12, the drain of the third PMOS transistor MP3 is connected with the source of the first PMOS transistor MP1 and the source of the second PMOS transistor MP2; the gate and the drain of the first NMOS transistor MN1 are short-circuited, and connected to the drain of the first PMOS transistor MP1, the source of the first NMOS transistor MN1 is grounded; the gate of the second NMOS transistor MN2 is connected to the gate of the first NMOS transistor MN1, and the drain of the second NMOS transistor MN2 is connected to the drain of the second PMOS transistor MP2 to be the voltage output terminal of the first-stage op amp circuit 10 for outputting the first output signal VOUT1, and the source of the second NMOS transistor MN2 is grounded.

In an example, the second-stage op amp circuit 11 includes: a fourth PMOS transistor MP4 and a third NMOS transistor MN3; wherein the gate of the fourth PMOS transistor MP4 is connected to the bias circuit 12; the gate of the third NMOS transistor MN3 is connected to the voltage output terminal of the first-stage op amp circuit 10, and the drain of the third NMOS transistor MN3 is connected to the drain of the fourth PMOS transistor MP4 to be as the voltage output terminal of the second-stage op amp circuit 11, used for outputting the second output signal VOUT2, and the source of the third NMOS transistor MN3 is grounded.

In an example, the bias circuit 12 includes: a fifth PMOS transistor MP5 and a current source IBIAS; wherein the gate of the fifth PMOS transistor MP5 is connected to the first-stage op amp circuit 10 and the second-stage op amp circuit 11. The gate and drain of the fifth PMOS transistor MP5 are connected to the current source with IBIAS. Specifically, the gate of the fifth PMOS transistor MP5 is connected to the gate of the third PMOS transistor MP3 and the gate of the fourth PMOS transistor MP4.

Figure 1:
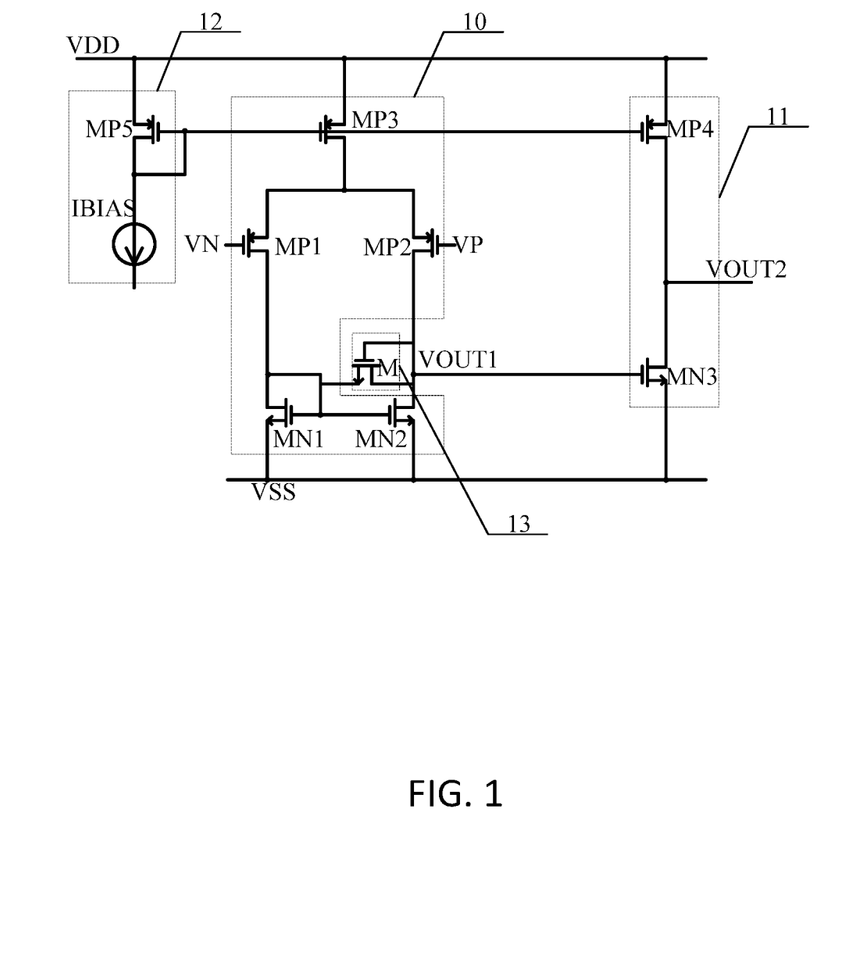
FIGS. 1 to 5 are circuit diagrams of comparators according to some embodiments of the disclosure.

In an example, as shown in FIG. 1, the clamping circuit 13 may include a first switch transistor M, a control terminal and a current input terminal of the first switch transistor M, and a voltage output terminal of the first-stage op amp circuit 10. The current output terminal of the first switch transistor M is connected to the gate of the second NMOS transistor MN2. In this example, the clamping circuit 13 can clamp the output terminal of the first-stage op amp circuit 10, and can clamp the highest voltage of the output terminal of the first-stage op amp circuit 10 to Vgs (the first switch transistor M's gate-source voltage)+Vgsn1 (the gate-source voltage of the first NMOS transistor MN1), so that when the second to-be-compared voltage VP is greater than the first to-be-compared voltage VN, the voltage VOUT1 of the output terminal of the first-stage op amp circuit 10 will be no longer necessary to pull down from a high potential (VDD−Vonp3−Vonp2, Vonp3 and Vonp2 are the conduction voltage values of the MP3 transistor and MP2 transistor respectively) to the ground potential, but pull down from a voltage of approximately Vgs+Vgsn1 (Vgs+Vgsn1 is less than VDD−Vonp3−Vonp2), so that the discharge delay to the first-stage op amp circuit 10 is reduced, thereby increasing the flipping voltage of the comparator. At the same time, the first-stage op amp voltage 10 has a smaller change range, so the coupling effect of the change of the first-level op amp circuit 10 on the first to-be-compared voltage VN and the second to-be-compared voltage VP is correspondingly reduced, and the first to-be-compared voltage VN and the second to-be-compared voltage VP are less interfered by kick back noise.

In an example, the first switch transistor M may include an NMOS transistor.

Figure 3:
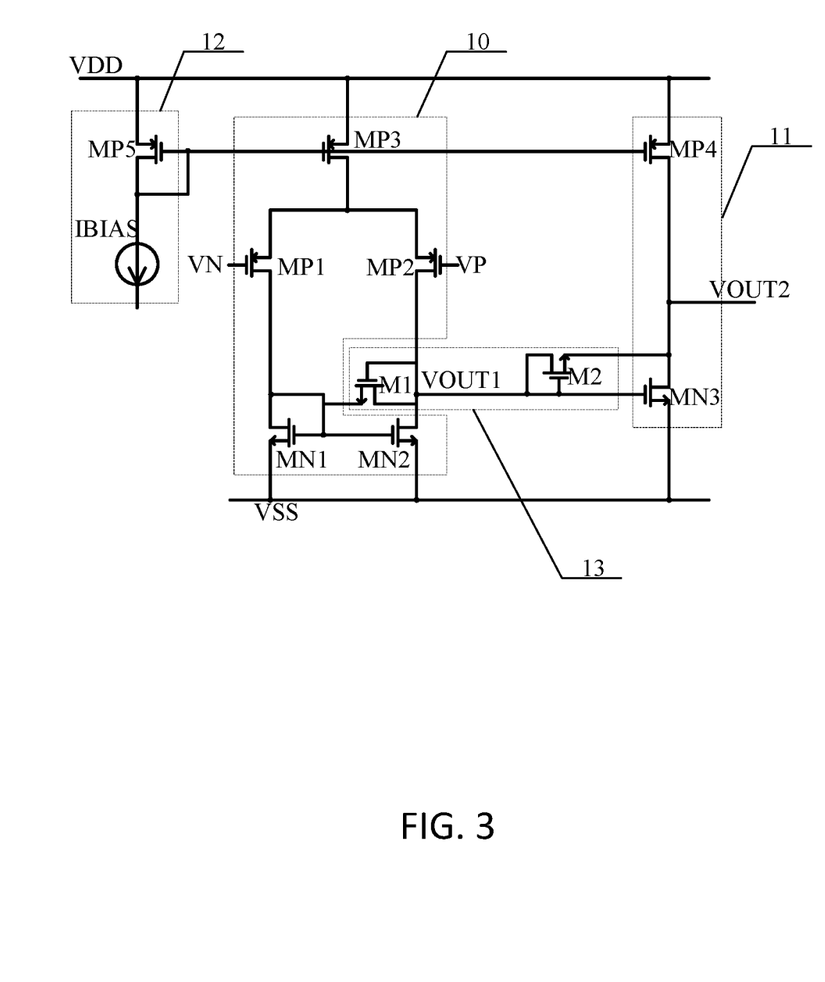

In another optional example, as shown in FIG. 3, the clamping circuit 13 may include a first switching transistor M1, a control terminal and a current input terminal of the first switching transistor M1, and a voltage output of the first-stage op amp circuit 10. The current output terminal of the first switching transistor M1 is connected to the gate of the second NMOS transistor MN2; the control terminal and current input terminal of the second switching transistor M2 are connected to the voltage output terminal of the first-stage op amp circuit 10. The current output terminal of the second switch transistor M2 is connected to the voltage output terminal of the second-stage op amp circuit 11.

In an example, the first switching transistor M1 may include an NMOS transistor, and the second switching transistor M2 may include an NMOS transistor.

Figure 2:
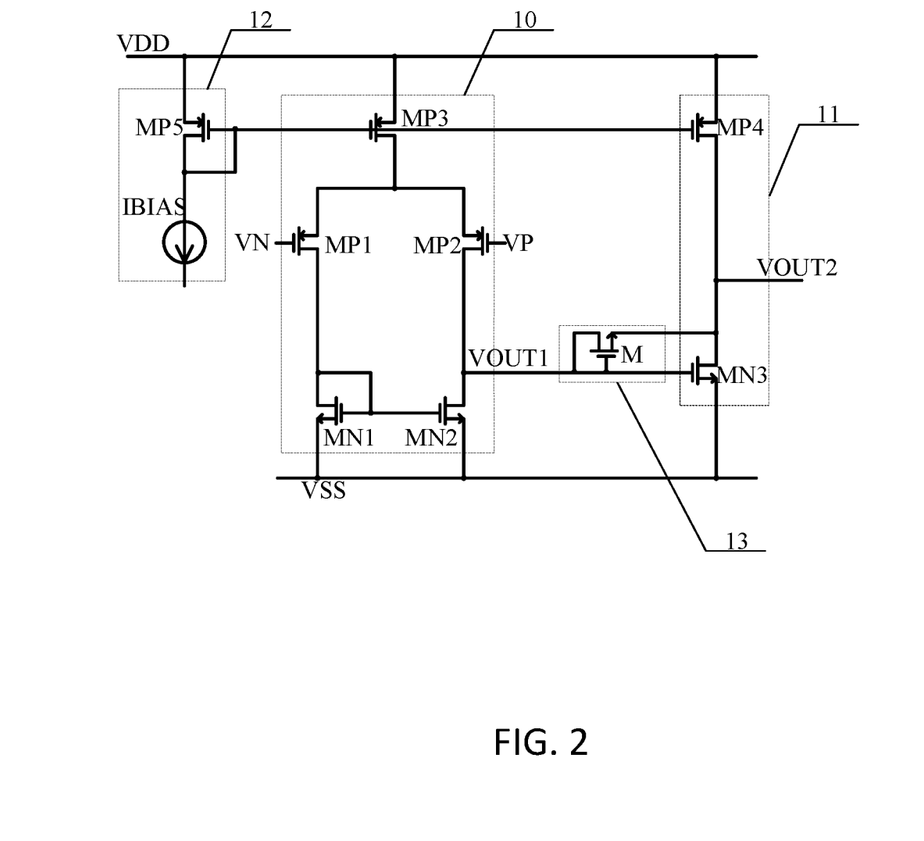

In yet another optional example, as shown in FIG. 2, the clamping circuit may include a switch transistor M. The control terminal and current input terminal of the switch transistor M are connected to the voltage output terminal of the first-stage op amp circuit 10, and the current output terminal of the switch transistor M is connected to the output terminal of the second-stage op amp circuit 11. In this example, the clamping circuit 13 can clamp the output terminal of the first-stage op amp circuit 10, and can clamp the highest voltage of the output terminal of the first-stage op amp circuit 10 to Vgs (the gate-source voltage of the switch transistor M)+Vdsn3 (the drain-source voltage of the third NMOS transistor MN3), so that when the second to-be-compared voltage VP is greater than the first to-be-compared voltage VN, the voltage VOUT1 at the output terminal of the first-stage op amp circuit 10 will no longer need to be pulled down from a high potential (VDD−Vonp3−Vonp2, wherein Vonp3 and Vonp2 are the on-voltage values of the MP3 transistor and MP2 transistor, respectively) to the ground potential, but instead pulled down from a voltage of about Vgs+Vdsn3, so that the discharge delay of the first-stage op amp circuit 10 is reduced, thereby increasing the flip voltage of the comparator. At the same time, the change range of the voltage from the first-stage op amp 10 is smaller, so the coupling effect from the change of the first-stage op amp circuit 10 to the first to-be-compared voltage VN and the second to-be-compared voltage VP is also reduced accordingly, and thus the first to-be-compared voltage VN and the second to-be-compared voltage VP will be less interfered by any kick back noise.

Returning to the structure of FIG. 3, combined with the analysis of FIGS. 1 and 2, it shows that the voltage VOUT1 at the output terminal of the first-stage op amp circuit 10 is clamped to be at the smaller value between Vgsm1+Vgsn1 (Vgsm1 is the gate-source voltage of the M1 transistor, and Vgsn1 is the gate-source voltage of the MN1 transistor) and Vgsm2+Vdsn3 (Vgsm2 is the gate-source voltage of the M2 transistor, and Vdsn3 is the drain-source voltage of the MN3 transistor), which further reduces the change range of the voltage VOUT1 at the output terminal of the first-stage op amp circuit 10, therefore it further increases the flipping speed of the comparator and reduces its kick back noise.

In an example, the switch transistor M may include an NMOS transistor.

Figure 4:
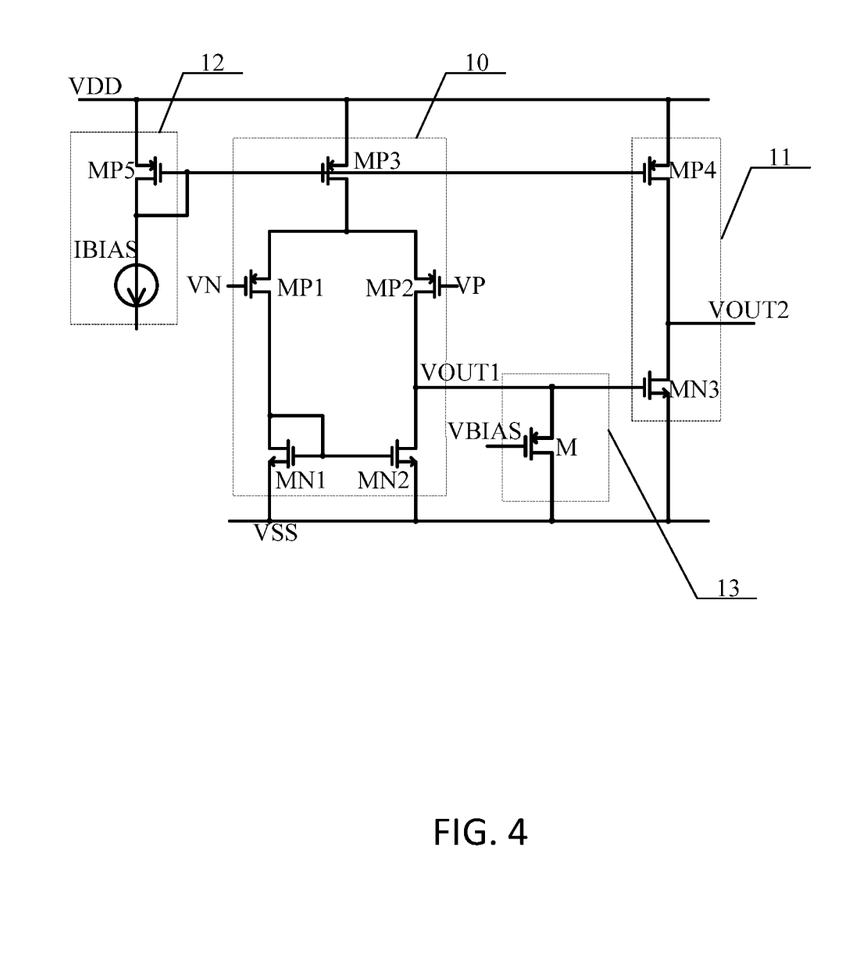

In yet another example, as shown in FIG. 4, the clamping circuit 13 may include a switch transistor M. The current input terminal of the switch transistor M is connected to the voltage output terminal of the first-stage op amp circuit 10. The control terminal is connected with the bias voltage VBIAS, and the current output terminal of the switch transistor M is grounded. In this example, the clamping circuit 13 can clamp the output terminal of the first-stage op amp circuit 10, and can clamp the highest voltage of the output terminal of the first-stage op amp circuit 10 to Vgs1 (the gate-source voltage of the switch transistor M)+VBIAS, in this way, when the second to-be-compared voltage VP is greater than the first to-be-compared voltage VN, the voltage VOUT1 of the output terminal of the first-stage op amp circuit 10 will no longer need to pull own from a high potential (VDD−Vonp3−Vonp2, wherein Vonp3 and Vonp2 are the turn-on voltage values of MP3 and MP2 transistors respectively) to the ground potential, instead will be pulled down from a voltage of about Vgs1+VBIAS (Vgs1+VBIAS is less than VDD−Vonp3−Vonp2), and will also be able to change the clamped voltage at the output terminal of the first-stage op amp circuit 10 by adjusting the VBIAS, so that the discharge delay from the first-stage op amp circuit 10 is reduced, thereby increasing the flipping speed of the comparator. At the same time, the change range of the voltage of the first-stage op amp circuit 10 is smaller, so the coupling effect from the change of the first-stage op amp circuit 10 to the first to-be-compared voltage VN and the second to-be-compared voltage VP is also reduced accordingly. The first to-be-compared voltage VN and the second to-be-compared voltage VP are less disturbed by kickback noise.

In an example, the switch transistor M may include a PMOS transistor or a PNP type transistor.

Figure 5:
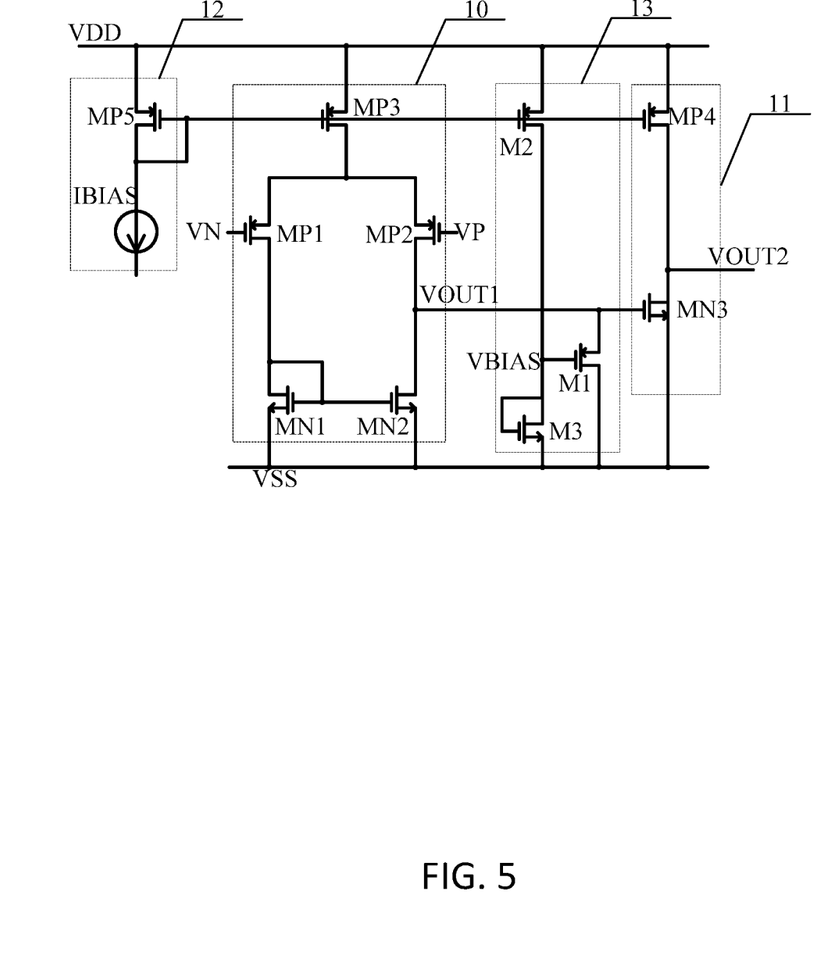

In another example, as shown in FIG. 5, the clamping circuit 13 may include: a first switching transistor M1, a second switching transistor M2, and a third switching transistor M3; wherein, the current input terminal of the first switching transistor M1 is connected with the voltage output terminal of the first-stage op amp circuit 10, the control terminal of the first switch transistor M1 is connected with the current output terminal of the second switch transistor M2 and the current input terminal of the third switch transistor M3; the control terminal of the second switch transistor M2 is connected to the bias circuit 12, specifically, the control terminal of the second switching transistor M2 is connected to the gate of the fifth PMOS transistor; the control terminal of the third switching transistor M3 is short-circuited connected with the current input terminal of the third switching transistor M3, and the circuit output terminal of the third switch transistor M3 is grounded. In this example, the bias voltage VBIAS connected to the gate of the first switching transistor M1 is the gate-source voltage of the third switching transistor M3. The first switching transistor M1, the second switching transistor M2, and the third switching transistor M3 are selected to have different transistor channel width-to-length ratios, the clamping circuit 13 can be adjusted to clamp the voltage output terminal of the first-stage op amp circuit 10 to a preset clamping voltage. For example, by increasing the channel width-to-length ratios of the first switch transistor M1, the second switch M2, or the third switch M3, the bias voltage VBIAS can be reduced, thereby reducing the clamping voltage; by decreasing the channel width-to-length ratios of the first switch transistor M1, the second switch M2, or the third switch M3, the bias voltage VBIAS can be increased, thereby increasing the clamping voltage.

In an example, the first switching transistor M1 includes a PMOS transistor or a PNP type transistor, the second switching transistor M2 includes a PMOS transistor, and the third switching transistor M3 includes an NMOS transistor.

The technical features of the above-mentioned embodiments can be combined arbitrarily. In order to make the description concise, not all possible combinations of the technical features of the above-mentioned embodiments are described. However, as long as there is no contradiction in the combination of these technical features, they should be It is considered as the range described in this specification.

The above-mentioned embodiments only express several implementation modes of the present application, and their descriptions are relatively specific and detailed, but they should not be understood as limiting the scope of the patent application. It should be pointed out that for those of ordinary skill in the art, without departing from the concept of this application, several modifications and improvements can be made, and these all fall within the protection scope of this application. Therefore, the scope of protection of the patent in this application shall be subject to the appended claims.

What is claimed is:

1. A comparator, comprising: a first-stage op amp (operational amplifier) circuit, a second-stage op amp circuit, a bias circuit, and a clamping circuit;
   wherein the first-stage op amp circuit comprises two voltage input terminals and a voltage output terminal, wherein the two voltage input terminals input two to-be-compared voltages respectively;
   wherein the second-stage op amp circuit is connected to the bias circuit and the voltage output terminal of the first-stage op amp circuit;
   wherein the clamping circuit connects to the voltage output terminal of the first-stage op amp circuit, and clamps a highest voltage from the voltage output terminal of the first-stage op amp circuit to a preset voltage;
   wherein the clamping circuit comprises a first switch transistor, a second switch transistor, and a third switch transistor;
   wherein a current input terminal of the first switch transistor is connected to the voltage output terminal of the first-stage op amp circuit, wherein a control terminal of the first switch transistor, a current output terminal of the second switch transistor, and a first current input terminal of the three switch transistors are connected together;
   wherein a control terminal of the second switch transistor is connected to the bias circuit;
   wherein a control terminal of the third switch transistor is short-circuited with a current input terminal of the third switch transistor; and
   wherein an output terminal of the third switch transistor is grounded.

2. The comparator according to claim 1, wherein the first-stage op amp circuit further comprises: a first PMOS transistor, a second PMOS transistor, a third PMOS transistor, a first NMOS transistor, and a second NMOS transistor;
   wherein a gate of the first PMOS transistor is connected to a first to-be-compared voltage;
   wherein a gate of the second PMOS transistor is connected to a second to-be-compared voltage;
   wherein a gate of the third PMOS transistor is connected to the bias circuit, and a drain of the third PMOS transistor is connected to a source of the first PMOS transistor and a source of the second PMOS transistor;
   wherein a gate and a drain of the first NMOS transistor are short-circuited and connected to a drain of the first PMOS transistor, and a source of the first NMOS transistor is grounded;
   wherein a gate of the second NMOS transistor is connected to a gate of the first NMOS transistor, and a drain of the second NMOS transistor is connected to a drain of the second PMOS transistor as the voltage output terminal of the first-stage op amp circuit; and
   wherein a source of the second NMOS transistor is grounded.

3. The comparator according to claim 2, and wherein a control terminal and a current input terminal of the first switch transistor are connected to the voltage output terminal of the first-stage op amp circuit, and wherein a current output terminal of the first switch transistor is connected to the gate of the second NMOS transistor.

4. The comparator according to claim 3, wherein the first switch transistor comprises an NMOS transistor.

5. The comparator according to claim 3, wherein the clamping circuit further comprises a second switch transistor, wherein a control terminal and a current input terminal of the second switch transistor are connected to the voltage output terminal of the first-stage op amp circuit, wherein the current output terminal of the second switch transistor is connected to a voltage output terminal of the second-stage op amp circuit.

6. The comparator according to claim 1, wherein the second-stage op amp circuit further comprises: a fourth PMOS transistor and a third NMOS transistor;
   wherein a gate of the fourth PMOS transistor is connected to the bias circuit;
   wherein a gate of the third NMOS transistor is connected to the voltage output terminal of the first-stage op amp circuit;

wherein a drain of the third NMOS transistor is connected to a drain of the fourth PMOS transistor as a voltage output terminal of the second-stage op amp circuit; and wherein a source of the third NMOS transistor is grounded.

7. The comparator according to claim 1, wherein the bias circuit comprises: a fifth PMOS transistor and a current source;

wherein a gate of the fifth PMOS transistor is connected to the first-stage op amp circuit and the second-stage op amp circuit, and wherein a drain of the fifth PMOS transistor is connected to the current source.

8. The comparator according to claim 1, wherein a control terminal and a current input terminal of the second switch transistor are connected to the voltage output terminal of the first-stage op amp circuit, and wherein a current output terminal of the switch transistor is connected with a voltage output terminal of the second-stage op amp circuit.

9. The comparator according to claim 8, wherein the switch transistor comprises an NMOS transistor.

10. The comparator according to claim 1, wherein the control terminal of the first switch transistor is connected with a bias voltage of the bias circuit, and wherein a current output terminal of the first switch transistor is grounded.

11. The comparator according to claim 1, wherein the first switch transistor comprises a PMOS transistor or a PNP type transistor, the second switch transistor comprises a PMOS transistor, and the third switch transistor comprises an NMOS transistor.

* * * * *